United States Patent [19]

Shaikh et al.

[11] Patent Number: 5,714,246

[45] Date of Patent: Feb. 3, 1998

[54] CONDUCTIVE SILVER LOW TEMPERATURE COFIRED METALLIC GREEN TAPE

[75] Inventors: Aziz S. Shaikh, Ventura; John H. Alexander, Goletta; Todd K. Williams, Santa Barbara; Mark A. Wesselmann, Carlsbad, all of Calif.

[73] Assignee: Ferro Corporation, Cleveland, Ohio

[21] Appl. No.: 579,076

[22] Filed: Dec. 22, 1995

Related U.S. Application Data

[63] Continuation of Ser. No. 243,620, May 13, 1994, abandoned.

[51] Int. Cl.⁶ .......................................... B32B 13/00
[52] U.S. Cl. .................... 428/323; 428/325; 428/328; 428/426; 428/702
[58] Field of Search .................... 428/209, 210, 428/697, 702, 426, 323, 328, 325; 501/19; 252/514

[56] References Cited

U.S. PATENT DOCUMENTS

| | | | |
|---|---|---|---|
| 3,656,984 | 4/1972 | Hoffman | 106/53 |
| 3,785,837 | 1/1974 | Amin | 106/52 |
| 3,787,219 | 1/1974 | Amin | 106/73.3 |
| 3,816,172 | 6/1974 | Hoffman | 117/212 |
| 3,837,869 | 9/1974 | Bacher et al. | 106/53 |
| 3,848,079 | 11/1974 | Amin | 174/68.5 |
| 3,939,295 | 2/1976 | Robertson et al. | 428/539 |
| 4,392,180 | 7/1983 | Nair | 361/321 |
| 4,609,582 | 9/1986 | Joormann et al. | 428/138 |
| 4,618,590 | 10/1986 | Baudry | 501/17 |
| 4,624,934 | 11/1986 | Kokubu et al. | 501/17 |
| 4,808,673 | 2/1989 | Hang et al. | 524/413 |
| 4,820,661 | 4/1989 | Nair | 501/79 |
| 4,830,988 | 5/1989 | Hang et al. | 501/21 |
| 4,948,759 | 8/1990 | Nair | 501/17 |
| 4,959,330 | 9/1990 | Donohue et al. | 501/8 |
| 4,985,376 | 1/1991 | Sunahara et al. | 501/22 |
| 5,071,794 | 12/1991 | Shaikh | 501/17 |
| 5,089,172 | 2/1992 | Allison et al. | 252/512 |
| 5,096,619 | 3/1992 | Slack | 252/514 |
| 5,165,986 | 11/1992 | Gardner et al. | 428/209 |
| 5,258,335 | 11/1993 | Muralidhar et al. | 501/20 |
| 5,298,330 | 3/1994 | Stadnicar, Jr. et al. | 428/432 |
| 5,346,651 | 9/1994 | Oprosky | 252/514 |
| 5,378,408 | 1/1995 | Carroll | 252/514 |

*Primary Examiner*—Timothy Speer
*Attorney, Agent, or Firm*—Rankin, Hill, Lewis & Clark

[57] ABSTRACT

The present invention provides a thermally conductive material which can be used as a heat sink in a multi-chip module or multilayer circuit structure. The material is formed by firing a composition including a solids portion comprising from about 1% to about 30% by weight glass and from about 70% to about 98% by weight silver. The glass comprises in weight percent from about 5% to about 60% $B_2O_3$, from about 30% to about 90% $SiO_2$, up to 10% $Li_2O$, up to 10% $Na_2O$, up to 10% $K_2O$ and up to 10% $Al_2O_3$. The material may be formed using a second glass selected from the group comprising of (i) a glass comprising in weight percent from about 10% to about 60% CaO, from about 5% to about 55% $B_2O_3$ and from about 5% to about 55% $SiO_2$; and (ii) a glass comprising in weight percent from about 35% to about 70% $SiO_2$, from about 20% to about 45% $Al_2O_3$, from about 0% to about 8% BaO and from about 5% to about 30% MgO.

8 Claims, No Drawings

CONDUCTIVE SILVER LOW TEMPERATURE COFIRED METALLIC GREEN TAPE

This is a continuation of application Ser. No. 08/243,620 filed on May 13, 1994 now abandoned.

FIELD OF INVENTION

This invention concerns a composition for forming a thermally conductive material. More particularly, this invention concerns a conductive silver low temperature cofired metallic green tape which upon firing forms a thermally conductive material.

BACKGROUND

Multi-Chip-Module (MCM) circuit structures and multi-layer circuit structures are well-known in the prior art. Such MCM circuits are fabricated using Low-Temperature-Cofired Ceramic (LTCC) dielectric green tape. Various LTCC dielectric green tape products are commercially available. One example of a LTCC dielectric green tape product is a tape sold under the trade designation A-6 by the Ferro Corporation of Cleveland, Ohio. Another example of a commercially available LTCC dielectric green tape is Du Pont tape sold under the trade designation 851AT.

One aspect of the LTCC dielectric green tape materials used to form MCM circuits and multilayer circuit structures is that such materials display poor thermal conductivity subsequent to firing. Thus, the MCM and multilayer circuits themselves display poor thermal conductivity. The poor thermal conductivity of MCM and multilayer circuits can be improved to some extent by making arrays of vias filled with a high thermal conductivity metal such as silver or gold. Using this technique, values of array thermal conductivity, perhaps as high as 20–30 W/M °K., can be achieved. However, for high power devices such as GaAs chips, greater thermal conductivity is generally required.

SUMMARY OF INVENTION

The present invention provides a silver containing low temperature cofired metallic green tape suitable for use in constructing a MCM structure that displays high thermal conductivity subsequent to firing. The use of silver in connection with a low temperature cofired metallic green tape would generally be considered to create a problem since silver has a high expansion rate upon heating as compared to conventional LTCC dielectric tape products. However, the silver containing low temperature cofired metallic green tape of the present invention is compatible for use with commercially available green LTCC dielectric tape products such as A-6 tape produced by the Ferro Corporation of Cleveland, Ohio. Thermal conductivities as high as 100° W/M° K. can be attained using the low temperature cofired metallic green tape of the present invention.

In one embodiment the present invention provides a low temperature cofired metallic green tape for use in a multi-chip module or a multilayer circuit structure comprising a solids portion and a binder, the solids portion comprising:

(A) from about 1% to about 30% of a first glass, the first glass comprising from about 5% to about 60% $B_2O_3$, from about 30% to about 90% $SiO_2$, up to about 10% $Li_2O$, up to about 10% $Na_2O$, up to about 10% $K_2O$ and up to about 10% $Al_2O_3$; and (B) from about 70% to about 98% silver.

The foregoing and other features of the invention are hereinafter more fully described and particularly pointed out in the claims, the following description setting forth in detail certain illustrative embodiments of the invention, these being indicative, however, of but a few of the various ways in which the principles of the present invention may be employed.

DESCRIPTION OF PREFERRED EMBODIMENTS

The thermally conductive material made in accordance with the principles of the present invention is formed by firing a mixture comprising a glass and silver. Preferably, for some applications, the thermally conductive material is formed by firing a mixture comprising a first glass, a second glass and silver. The second glass may be included in order to control the expansion or shrinkage of the thermally conductive material so as to render it compatible for use in conjunction with other materials (e.g., a LTCC dielectric green tape).

The first glass has the following composition in weight percent:

| Component | Preferred | More Preferred | Most Preferred |
|---|---|---|---|
| $B_2O_3$ | 5–60 | 10–50 | 15–45 |
| $SiO_2$ | 30–90 | 40–80 | 55–75 |
| $Li_2O$ | 0–10 | .01–5 | .05–3 |
| $Na_2O$ | 0–10 | .01–5 | .05–3 |
| $K_2O$ | 0–10 | .01–5 | .05–3 |
| $Al_2O_3$ | 0–10 | .01–5 | 05–3 |

A second glass (i) that may be included to control the shrinkage or expansion of the conductive material has the following composition in weight percent:

| Component | Preferred | More Preferred | Most Preferred |
|---|---|---|---|
| CaO | 10–60 | 20–50 | 25–45 |
| $B_2O_3$ | 5–55 | 10–50 | 15–45 |
| $SiO_2$ | 5–55 | 10–50 | 15–45 |

Another second glass (ii) that may be included so as to control the shrinkage or expansion of the conductive material has the following composition in weight percent:

| Component | Preferred | More Preferred | Most Preferred |
|---|---|---|---|
| $SiO_2$ | 35–70 | 37–68 | 39–64 |
| $Al_2O_3$ | 20–45 | 22–43 | 24–41 |
| BaO | 0–8 | .5–6 | 1–5 |
| MgO | 5–20 | 7–18 | 8–17 |

The "solids portion" of the mixture utilized to produce the thermally conductive material of the present invention (i.e., the glass(es) and silver exclusive of any binder or vehicle) has the following composition:

| | Preferred | More Preferred | Most Preferred |
|---|---|---|---|
| First Glass | 1–30 | 3–30 | 4–30 |
| Second Glass | 1–30 | 4–30 | 5–25 |
| Silver | 70–98 | 70–95 | 70–90 |

The thermally conductive material of the present invention is generally formed by firing a "green tape." The green tape comprises the precursors of the thermally conductive material (i.e., the solids portion) dispersed in a flexible solid binder. The green tape generally comprises from about 15% to about 45% by weight binder and from about 55% to about 90% solids portion. The green tape is generally sold in connection with a flexible substrate, the green tape removably adhered to one side of the flexible substrate. Such flexible substrates may comprise any one of a number of conventional flexible substrate materials such as a polymeric film like MYLAR film, or a film formed of polycarbonate, polypropylene, polyester or various other materials. Such flexible substrates are used to produce conventional LTCC dielectric green tapes.

The green tapes of the present invention are made by casting a dispersion or slip of the solids portion in an organic binder or vehicle onto the flexible substrate, and then heating the cast layer to remove any volatile solvents. The binder or vehicle is preferably an organic binder or vehicle and is provided in an amount sufficient to disperse the solids in the binder or vehicle and to at least temporarily bond the composition together and form a flexible sheet or tape prior to firing. The organic binder or vehicle is usually an organic resin dissolved in a suitable solvent. Any essentially inert binder can be used in the practice of the present invention, including various organic liquids, with or without thickening and/or stabilizing agents and/or other common additives. Examples of the organic liquids which can be used are the aliphatic alcohols, esters of such alcohols, for example the acetates and propionates; terpenes such as pine oil, terpineol and the like; solutions of resins such as the polymethacrylates of lower alcohols, or solutions of ethyl cellulose, or solvents such as pine oil, the monobutyl ether of ethylene glycol monoacetate, and carbinol.

The glass compositions can be prepared in a conventional manner. For example, a mixture of the appropriate ingredients can be placed in a platinum crucible and melted (e.g., 1450° C.–1550° C.), the resulting glass composition is then poured onto cold steel rolls to form thin flakes or frit which is suitable for milling. These flakes are then milled in a solvent to a suitable particle size distribution (e.g., about 0.5 to about 20 microns and preferably about 3 to about 5 microns). The solvents preferably have a boiling point below about 150° C. and the heating step used to remove the solvent is conducted at a sufficient temperature to vaporize the solvent. Examples of such solvents include water, acetone, xylene, methanol, ethanol, isopropanol, methyl ethyl ketone, 1,1,1-trichlorethane, tetrachloroethylene, amyl acetate, 2,2,4-triethyl pentanediol-1,3-monoisobutyrate, toluene, methylene chloride and fluorocarbons.

Various conventional silver powders may be utilized in connection with the present invention. Preferably, the silver displays an average particle size distribution of about 5 to 10 microns.

The slip that is utilized to produce the green tape of the present invention is produced by providing a mixture of the solids portion and the vehicle or binder. The mixture is processed through a three roll mill, with low roll pressures being preferred. More particularly, it is important not to use processes like ball milling that might flake the silver during slip preparation. The spherical shape of the silver particles must be maintained during the milling operation. Generally, better results can be obtained by using larger, rather than finer silver powders.

It will be appreciated that in addition to forming the thermally conductive material of the present invention using a green tape, it may also be formed using a thick film paste. The thick film paste can be applied to a substrate using techniques well-known in the art. Such techniques include silk screening, spraying, dipping, spinning, brushing and application using a doctor blade. A thick film paste made in accordance with the present invention would include the same solids portion as the above described green tape, and a suitable conventional vehicle. Such thick film paste would comprise from about 55% to about 90% by weight solids portion and from about 15% to about 45% by weight vehicle.

In order to fine-tune or better match the TCE (thermal coefficient of expansion) of the thermally conductive material to that of the LTCC dielectric tape which the material is intended to be used with, one may include expansion modifier additives such as silicon (Si), silicon carbide (SiC), aluminum nitride (AlN) and other materials that have high thermal conductivity and low TCE's. Additional potential expansion modifiers include $CaZrO_3$, $CaSiO_3$, $Mg_2SiO_4$, $CaTiO_3$, $BaZrO_4$ and $SrZrO_3$. Mixtures of such expansion modifiers may also be utilized. When producing a green tape or a thick film paste, such tape or film may include from about 0.01% to about 3% by weight expansion modifier.

The thermally conductive material can also be made using a refractory oxide in order to control shrinkage. Typical refractory oxide compositions include BeO, $Al_2O_3$, $TiO_2$, $SiO_2$ and $ZrO_2$. Mixtures of such refractory oxide compositions may also be utilized. When producing a green tape or a thick film paste, such tape or film may include from about 0.01% to about 3% by weight refractory oxide.

A monolithic microelectronic circuit package which includes the thermally conductive material of the present invention comprises a dielectric structure formed prior to firing by a plurality of stacked sheets of low thermal conductivity dielectric LTCC green tape. A hole or opening is formed through the stacked sheets of dielectric LTCC green tape. A heat sink is formed by a plurality of stacked sheets of the low temperature cofired metallic green tape of the present invention disposed in the hole. Once the circuit package is built, the package is then fired using conventional techniques at a temperature of about 800° C. to about 960° C., and preferably from about 850° C. to about 950° C. It will be appreciated that various conventional techniques may be employed and various circuit packages built when building circuit packages using the low temperature cofired metallic green tape of the present invention.

In order to further illustrate the invention, the following Examples are provided. Unless otherwise indicated, in the following Examples as well as throughout the entire specification and in the appended claims, all parts and percentages are by weight, and all temperatures are in degree centigrade.

EXAMPLE 1

A mixture having the following composition is provided:

| Component | Weight In Grams | | | |
| --- | --- | --- | --- | --- |
| | A | B | C | D |
| Glass 1 | 1.25 g | .93 g | .74 g | 1.02 g |
| Glass 2 | .75 g | — | — | — |
| Glass 3 | — | .55 g | .74 g | .83 g |
| Silver[1] | 6.00 g | 7.78 g | 7.78 g | 7.78 g |
| Vehicle[2] | 1.20 g | 4.4 g | 4.6 g | 4.2 g |
| Vehicle[3] | .60 g | 0.07 g | 0.07 g | 0.07 g |
| Santicizer[4] | .20 g | — | — | — |

-continued

| Component | Weight In Grams | | | |
|---|---|---|---|---|
| | A | B | C | D |
| $SiO_2$[5] | — | .37 | .74 | .19 |
| $ZrO_2$[6] | — | .37 | — | .18 |

[1]Powdered silver available from Metz Metallurgical Corporation of South Plainfield, New Jersey, under the trade designation 241.
[2]Vehicle available from Ferro Corporation of Cleveland, Ohio, under the trade designation V405.
[3]Vehicle available from Ferro Corporation under the trade designation V406.
[4]Butyl benzyl phthalate available from Monsanto of St. Louis, Missouri, under the trade designation SANTICIZER 160.
[5]Sol-Gel Material (0.1 micron) available from Geltech of Alchua, Florida.
[6]$Y_2O_3$ stabilized $ZrO_2$ (0.5 micron) available from American Vermiculite Corporation of Marietta, Georgia.

Glass 1 comprises by weight 28% $B_2O_3$, 69% $SiO_2$, 0.5% $Li_2O$, 0.5% $Mg_2O$, 1.0% $K_2O$ and 1.0% $Al_2O_3$. Glass 2 comprises by weight 39% CaO, 32% $B_2O_3$ and 29% $SiO_2$. Glass 3 comprises by weight 52.5% $SiO_2$, 32.0% $Al_2O_3$, 2% $B_2O$ and 13.5% MgO.

The mixtures were lightly milled on a three roll mill. The mixture is then cast on MYLAR film using conventional casting techniques and the solvents dried at 60° C. The milled mixtures have an average particle size of 8 microns. Green tapes each having a thickness of about 5.0 mils may then be peeled off of the MYLAR film. The green tapes are suitable for use in forming a thermally conductive layer in a MCM structure. The green tapes are used in a conventional manner during the building of MCM structures or multilayer substrates, such conventional techniques including the steps of stacking the layers and laminating as is done using conventional LTCC dielectric tapes.

EXAMPLE 2

A mixture having the following composition is provided:

| Component | Weight |
|---|---|
| Glass | .81 g |
| Silver[1] | 6.00 g |
| Vehicle[2] | 1.20 g |
| Vehicle[3] | .60 g |
| Santicizer[4] | .20 g |

[1]Powdered silver available from Metz Metallurgical Corporation of South Plainfield, New Jersey, under the trade designation SPD2.
[2]Vehicle available from Ferro Corporation of Cleveland, Ohio, under the trade designation V405.
[3]Vehicle available from Ferro Corporation under the trade designation V406.
[4]Butyl benzyl phthalate available from Monsanto of St. Louis, Missouri, under the trade designation SANTICIZER 160.

The glass comprises by weight 28% $B_2O_3$, 69% $SiO_2$, 0.5% $Li_2O$, 0.5% MgO, 1% $K_2O$ and 1.0% $Al_2O_3$. The mixture is prepared in the same manner as Example 1 above and renders a green tape that may be utilized to produce a thermally conductive layer in a MCM structure.

While the invention has been explained in relation to its preferred embodiments, it is to be understood that various modifications thereof will become apparent to those skilled in the art upon reading this specification. Therefore, it is to be understood that the invention disclosed herein is intended to cover such modifications as fall within the scope of the appended claims.

What is claimed:

1. A low temperature metallic green unfired tape for use in forming a circuit structure comprising a binder and a solids portion, said solids portion comprising:

A. from about 1% to about 30% by weight of a first glass comprising in weight percent from about 5% to about 60% $B_2O_3$, from about 30% to about 40% $SiO_2$, up to 10% $Li_2O$, up to 10% NaO, up to 10% $K_2O$ and up to 10% $Al_2O_3$;

B. from about 1% to about 30% by weight of a second glass selected from the group consisting of: (i) a glass comprising in weight percent from about 10% to about 60% CaO, from about 5% to about 55% $B_2O_3$ and from about 5% to about 55% $SiO_2$; (ii) a glass comprising from about 35% to about 70% $SiO_2$, from about 20% to about 45% $Al_2O_3$, from about 0% to about 8% BaO and from about 5% to about 20% MgO; and C. from about 70% to about 98% by weight silver.

2. A green tape as set forth in claim 1 wherein said second glass (i) comprises from about 20% to about 50% CaO, from about 10% to about 50% $B_2O_3$, and from about 10% to about 50% $SiO_2$ and said second glass (ii) comprises from about 37% to about 68% $SiO_2$, from about 22% to about 43% $Al_2O_3$, from about 0.5% to about 6% BaO, and from about 7% to about 18% MgO.

3. A green tape as set forth in claim 1 wherein said second glass (i) comprises from about 25% to about 45% CaO, from about 15% to about 45% $B_2O_3$ and from about 15% to about 45% $SiO_2$ and said second glass (ii) comprises from about 29% to about 64% $SiO_2$, from about 24% to about 41% $Al_2O_3$, from about 1% to about 5% BaO, and from about 8% to about 17% MgO.

4. A green tape as set forth in claim 1 wherein said first glass comprises from about 10% to about 50% $B_2O_3$, from about 40% to about 80% $SiO_2$, from about 0.01% to about 5% $Li_2O$, from about 0.01% to about 5% $Na_2O$, from about 0.01% to about 5% $K_2O$ and from about 0.01% to about 5% $Al_2O_3$.

5. A green tape as set forth in claim 1 wherein said first glass comprises from about 15% to about 45% $B_2O_3$, from about 55% to about 75% $SiO_2$, from about 0.05% to about 3% $Li_2O$, from about 0.05% to about 3% $Na_2O$, from about 0.05% to about 3% $K_2O$ and from about 0.05% to about 3% $Al_2O_3$.

6. A green tape as set forth in claim 1 including a refractory filler selected from the group consisting of BeO, $Al_2O_3$, $SiO_2$ and $ZrO_2$.

7. A green tape as set forth in claim 1 including at least one thermally conductive expansion modifier selected from the group consisting of aluminum nitride, silicon, silicon carbide, $CaZrO_3$, $CaSiO_3$, $Mg_2SiO_4$, $CaTiO_3$, $BaZrO_3$ and $SrZrO_3$.

8. A green tape as set forth in claim 1 wherein said particle size of said silver is in the range of from about 5 to about 10 microns.

* * * * *